US009694575B2

(12) United States Patent
Fujii et al.

(10) Patent No.: US 9,694,575 B2
(45) Date of Patent: Jul. 4, 2017

(54) SEMICONDUCTOR DEVICE, LIQUID DISCHARGE HEAD, LIQUID DISCHARGE CARTRIDGE, AND LIQUID DISCHARGE APPARATUS

(71) Applicant: CANON KABUSHIKI KAISHA, Tokyo (JP)

(72) Inventors: Kazunari Fujii, Tokyo (JP); Tetsunobu Kochi, Hiratsuka (JP); Wataru Endo, Tokyo (JP); Takaaki Yamaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/162,690

(22) Filed: May 24, 2016

(65) Prior Publication Data

US 2016/0355008 A1    Dec. 8, 2016

(30) Foreign Application Priority Data

Jun. 2, 2015  (JP) ................................ 2015-112404

(51) Int. Cl.
*B41J 2/045* (2006.01)
*H01L 27/06* (2006.01)

(52) U.S. Cl.
CPC ......... *B41J 2/04541* (2013.01); *B41J 2/0455* (2013.01); *B41J 2/0458* (2013.01); *B41J 2/04543* (2013.01); *H01L 27/0629* (2013.01)

(58) Field of Classification Search
CPC .. B41J 2/04541; B41J 2/0458; B41J 2/04543; H01L 27/0629
See application file for complete search history.

(56) References Cited

U.S. PATENT DOCUMENTS

| 9,302,478 B2 | 4/2016 | Suzuki et al. ........... B41J 2/135 |
| 2003/0160836 A1* | 8/2003 | Fukano .................. B41J 2/0452 347/12 |
| 2010/0134543 A1 | 6/2010 | Hirayama et al. .............. 347/10 |
| 2015/0283807 A1 | 10/2015 | Fujii et al. ................. B41J 2/14 |

FOREIGN PATENT DOCUMENTS

JP    2010-155452 A    7/2010

* cited by examiner

*Primary Examiner* — Julian Huffman
(74) *Attorney, Agent, or Firm* — Fitzpatrick, Cella, Harper & Scinto

(57) ABSTRACT

A semiconductor device for a liquid discharge head is provided. The device includes first transistors configured to receive a first voltage at a first terminal and second transistors configured to receive a second voltage at a first terminal. The device further includes discharge elements configured to discharge a liquid. Each discharge element is connected between a second terminal of a first transistor and a second terminal of a second transistor. A first control circuit is configured to supply a first control signal for controlling a conductive state of the first transistors via a common signal. A stabilization circuit is configured to stabilize a voltage of at least one of the second terminal of the first transistor or the control terminal of the first transistor.

18 Claims, 8 Drawing Sheets

SEMICONDUCTOR DEVICE, LIQUID DISCHARGE HEAD, LIQUID DISCHARGE CARTRIDGE, AND LIQUID DISCHARGE APPARATUS

BACKGROUND OF THE INVENTION

Field of the Invention

The present invention relates to a semiconductor device, a liquid discharge head, a liquid discharge cartridge, and a liquid discharge apparatus.

Description of the Related Art

Japanese Patent Laid-Open No. 2010-155452 proposes the following arrangement as a semiconductor device for a liquid discharge head which discharges a liquid from an orifice. One end of a heater which gives thermal energy to the liquid is connected to a power supply voltage via a transistor and the other end of the heater is connected to ground via another transistor. A control circuit of the semiconductor device turns on both of these transistors when the liquid is discharged. The control circuit of the semiconductor device turns off both of these transistors when no liquid is discharged.

SUMMARY OF THE INVENTION

When both transistors connected to two ends of a heater are OFF, the heater is set in a floating state. Consequently, a voltage of the heater in the floating state may change due to an influence of a transistor leakage current or a photoelectric effect by light outside the semiconductor device. If the voltage of the heater varies for each timing at which the heater is driven, the waveform of an electric current flowing through the heater also varies accordingly. Some aspects of the present invention provide a technique of reducing a variation in the waveform of an electric current which flows through an element giving energy to a liquid.

According to some embodiments, a semiconductor device for a liquid discharge head is provided. The device comprises a plurality of first transistors each including a first terminal, a second terminal, and a control terminal, and configured to receive a first voltage at the first terminal; a plurality of second transistors each including a first terminal, a second terminal, and a control terminal, and configured to receive a second voltage at the first terminal; a plurality of discharge elements configured to discharge a liquid, each discharge element being connected between the second terminal of one of the plurality of first transistors and the second terminal of one of the plurality of second transistors; a first control circuit configured to supply a first control signal for controlling a conductive state of the plurality of first transistors to the control terminals of the plurality of first transistors via a common signal line connected to the plurality of first transistors; and a stabilization circuit configured to stabilize a voltage of at least one of the second terminal of the first transistor or the control terminal of the first transistor.

Further features of the present invention will become apparent from the following description of exemplary embodiments (with reference to the attached drawings).

DESCRIPTION OF THE EMBODIMENTS

Figure 1:
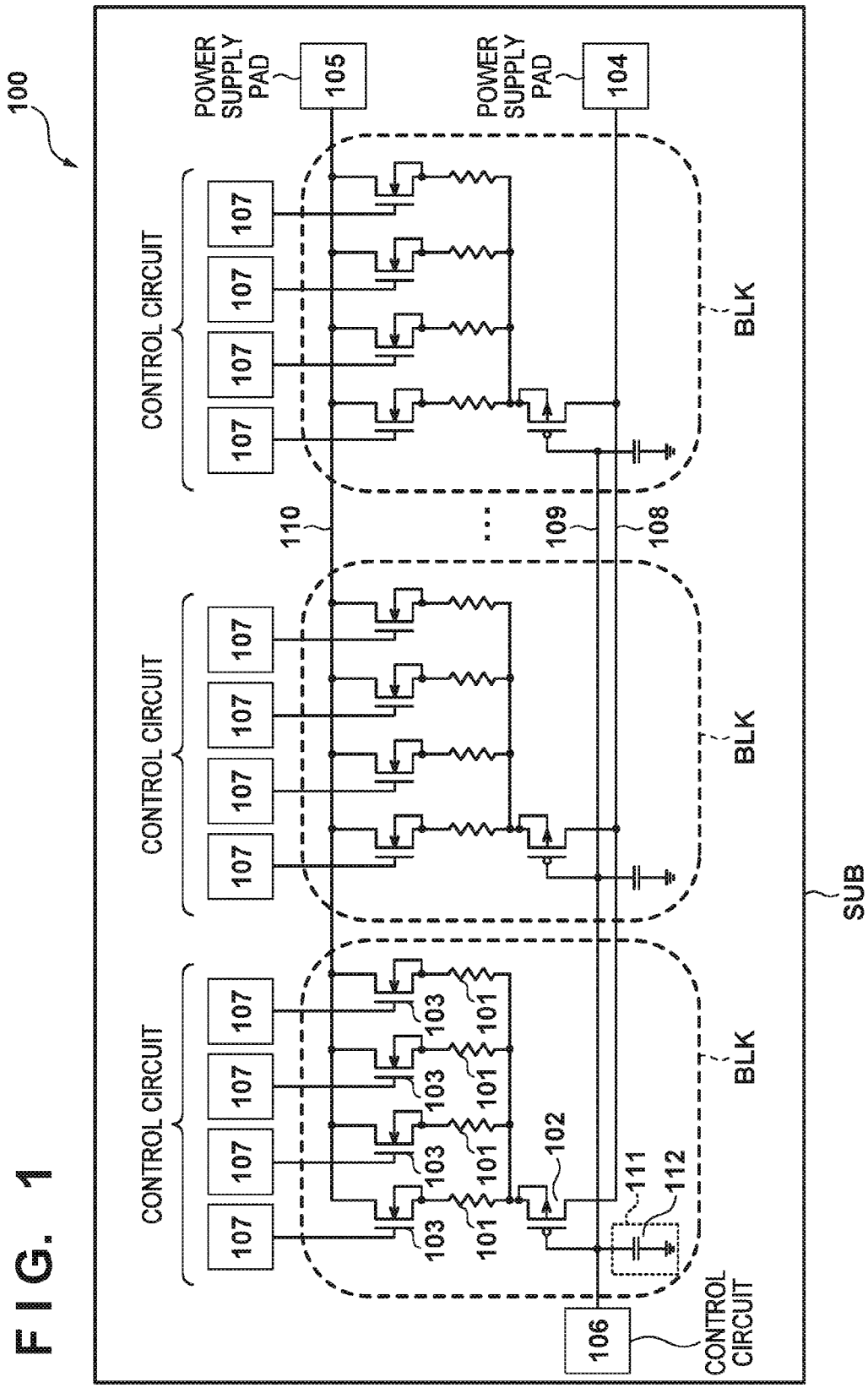
FIG. 1 is an equivalent circuit diagram of a semiconductor device according to an embodiment of the present invention.

Embodiments of the present invention will be explained below with reference to the accompanying drawings. In these embodiments, the same reference numerals denote the same elements, and a repetitive explanation will be omitted. Also, these embodiments can be changed and combined as needed. An embodiment of the present invention relates to a semiconductor device for a liquid discharge head. The liquid discharge head is, for example, an inkjet printing head used for an inkjet printing apparatus (inkjet printer).

An arrangement example of a semiconductor device 100 for the liquid discharge head according to an embodiment will be explained with reference to a circuit diagram of FIG. 1. The semiconductor device 100 includes a substrate SUB, a plurality of heaters 101, a plurality of transistors 102 on a ground side (hereinafter, ground-side transistor), a plurality of transistors 103 on a power supply side (hereinafter, power-supply-side transistor), conductive pads 104 and 105, a control circuit 106, a plurality of control circuits 107, and a plurality of stabilization circuits 111. The components such as the plurality of heaters 101 are formed on the substrate SUB.

The plurality of heaters 101 are laid out in the longitudinal direction (the horizontal direction in FIG. 1) of the substrate SUB. The arrangement of each heater 101 will be explained below. The heater 101 is, for example, a heating resistor, has two terminals (the upper terminal and the lower terminal in FIG. 1), and generates heat when an electric current flows between these terminals. When the heater 101 generates heat, a liquid is heated accordingly and the liquid is discharged from the liquid discharge head. The heater 101 is an example of a discharge element. The discharge element can discharge a liquid by giving energy to the liquid. The discharge element which gives the energy to the liquid as described above may be an element other than the heater 101 and may be, for example, a piezoelectric element. The discharge element which gives the energy to the liquid can also be called a printing element. One heater 101 is connected between any one of the plurality of ground-side transistors 102 and any one of the plurality of power-supply-side transistors 103. By such a connection, the power-supply-side transistors 103, the heaters 101, and the ground-side transistors 102 can form one electric current path. In this example, each of all the heaters is connected between one ground-side transistor 102 and one power-supply-side transistor 103. However, the substrate SUB may further include a heater other than these.

The plurality of ground-side transistors 102 are laid out in the longitudinal direction of the substrate SUB. The arrangement of each ground-side transistor 102 will be explained below. The ground-side transistor 102 includes two primary terminals and one control terminal. The ground-side transistor 102 is, for example, a PMOS transistor. In this case, the source and the drain of the PMOS transistor are the primary terminals, and the gate is the control terminal. The source of the ground-side transistor 102 is connected to one terminal (the lower terminal in FIG. 1) of the heater 101. The drain of the ground-side transistor 102 is connected to the conductive pad 104 via a conductive line 108. The gate of the ground-side transistor 102 is connected to the control circuit 106 via a signal line 109. The back gate of the ground-side transistor 102 is connected to the source of the ground-side transistor 102.

The plurality of power-supply-side transistors 103 are laid out in the longitudinal direction of the substrate SUB. The arrangement of each power-supply-side transistor 103 will be explained below. The power-supply-side transistor 103 includes two primary terminals and one control terminal. The power-supply-side transistor 103 is, for example, an NMOS transistor. In this case, the source and the drain of the NMOS transistor are the primary terminals, and the gate is the control terminal. The source of the power-supply-side transistor 103 is connected to the other terminal (the upper terminal in FIG. 1) of the heater 101. The drain of the power-supply-side transistor 103 is connected to the conductive pad 105 via a conductive line 110. The gate of the power-supply-side transistor 103 is connected to the control circuit 107. The back gate of the power-supply-side transistor 103 is connected to the source of the power-supply-side transistor 103.

A predetermined voltage is supplied to the conductive pad 104 outside the semiconductor device 100. The voltage supplied to the conductive pad 104 is transmitted via the conductive line 108 and supplied to the drains of the plurality of ground-side transistors 102 connected to the conductive line 108 in common. A predetermined voltage is supplied to the conductive pad 105 outside the semiconductor device 100. The voltage supplied to the conductive pad 105 is transmitted via the conductive line 110 and supplied to the drains of the plurality of power-supply-side transistors 103 connected to the conductive line 110 in common. The voltages different from each other are supplied to the conductive pads 104 and 105, respectively. The voltage higher than that of the conductive pad 104 may be supplied to the conductive pad 105 or the voltage lower than that of the conductive pad 104 may be supplied to the conductive pad 105. In this embodiment, a ground voltage is supplied to the conductive pad 104 and a positive power supply voltage is supplied to the conductive pad 105.

The control circuit 106 supplies, via the signal line 109, control signals to the gates of the plurality of ground-side transistors 102 connected to the signal line 109 in common. In accordance with the control signals supplied by the control circuit 106, ON/OFF of the ground-side transistors 102 is switched. When the ground-side transistors 102 are ON, a conductive state is set between the heaters 101 and the conductive line 108 connected by the ground-side transistors 102. When the ground-side transistors 102 are OFF, a non-conductive state (in other words, an open state) is set between them. That is, the ground-side transistors 102 function as switching elements which switch the conductive state between the heaters 101 and the conductive line 108.

The arrangement of each of the plurality of control circuits 107 will be explained below. The control circuits 107 supply control signals to the gates of the power-supply-side transistors 103 connected to the control circuits 107 individually. In accordance with the control signal supplied by the control circuit 107, ON/OFF of the power-supply-side transistor 103 is switched. When the power-supply-side transistor 103 is ON, the conductive state is set between the heater 101 and the conductive line 110 connected by the power-supply-side transistor 103. When the power-supply-side transistor 103 is OFF, the non-conductive state is set between them. That is, the power-supply-side transistor 103 functions as a switching element which switches the conductive state between the heater 101 and the conductive line 110.

The arrangement of each of the plurality of stabilization circuits 111 will be explained below. The stabilization circuit 111 is provided for the corresponding ground-side transistor 102 and is connected to the gate of that ground-side transistor 102. The signal line 109 is also connected to the gate of the ground-side transistor 102, and thus the stabilization circuit 111 is also connected to the signal line 109. As shown in FIG. 1, a path which connects the stabilization circuit 111 and the ground-side transistor 102, and a path which connects the control circuit 106 and the ground-side transistor 102 may have an overlapping portion. The stabilization circuit 111 includes a capacitive element 112. One electrode (the upper electrode in FIG. 1) of the capacitive element 112 is connected to the gate of the ground-side transistor 102. The other electrode (the lower electrode in FIG. 1) of the capacitive element 112 is grounded. The function of the stabilization circuit 111 will be described later.

The plurality of heaters 101, the plurality of ground-side transistors 102, and the plurality of power-supply-side transistors 103 are divided into a plurality of blocks BLK. In this embodiment, each block BLK includes four heaters 101, one ground-side transistor 102 connected to the four heaters 101 in common, and four power-supply-side transistors 103 connected to the four heaters 101 on a one-to-one basis. The plurality of blocks BLK are laid out in the longitudinal direction of the substrate SUB. A way of dividing the blocks BLK is not limited to an example in FIG. 1. Each block BLK suffices to include one or more heaters 101, and one or more ground-side transistors 102 and one or more power-supply-side transistors 103 connected to the one or more heaters 101. Further, the plurality of blocks BLK may be different from each other in arrangement.

The semiconductor device 100 of this embodiment includes the plurality of stabilization circuits 111. One stabilization circuit 111 is arranged for each block BLK. Instead of this, the stabilization circuits 111 may be arranged for only some blocks BLK. For example, one stabilization circuit 111 may be arranged for a plurality of blocks BLK.

Figure 2A:
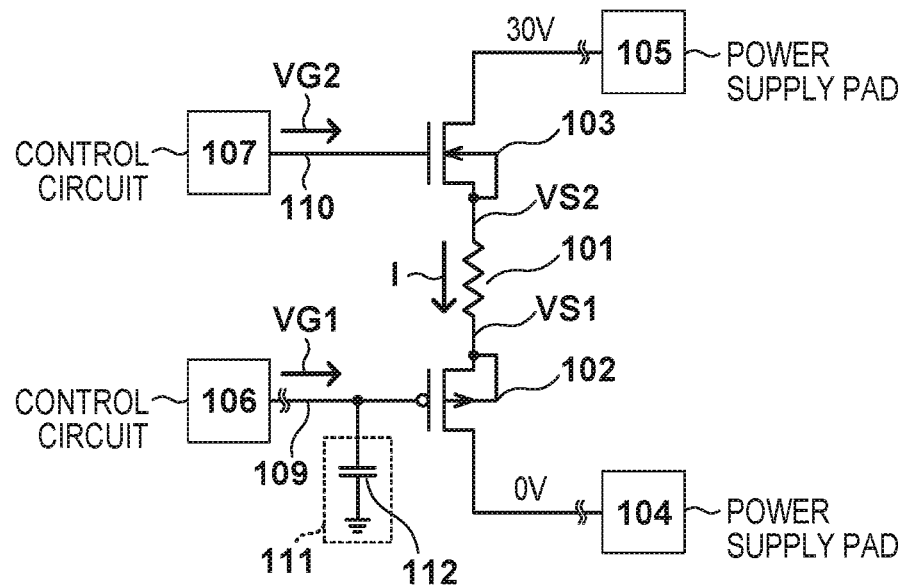
FIGS. 2A and 2B are circuit diagrams in which attention is paid to a part of FIG. 1.
Figure 2B:
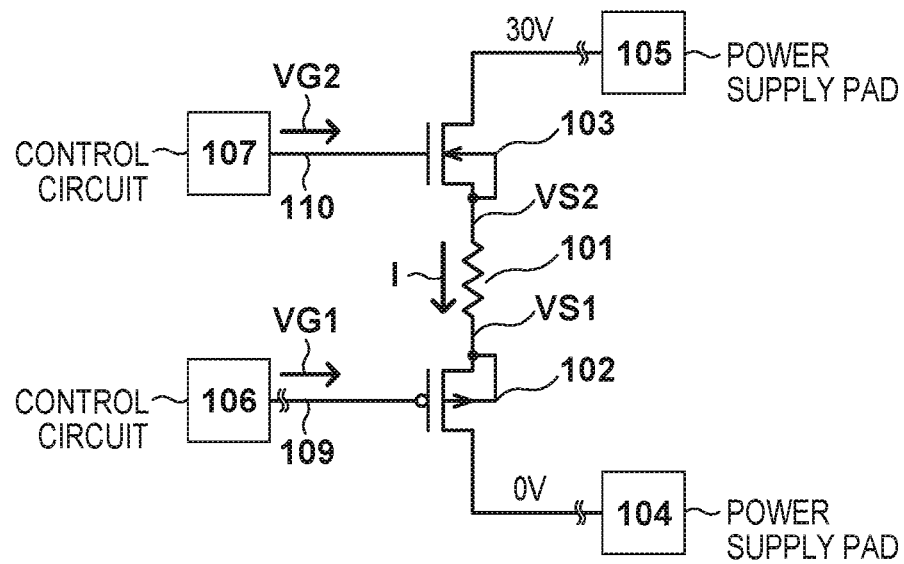

An example of the operation of the semiconductor device 100 will now be explained with reference to FIGS. 2A to 3D. FIG. 2A is a circuit diagram in which attention is paid to one heater 101 of the semiconductor device 100 and circuit elements connected to this heater 101. FIG. 2B is a circuit diagram of a comparative example to be described later. FIGS. 3A to 3D are timing charts for explaining changes in voltages or electric currents in respective positions of the semiconductor device 100 by paying attention to this one heater 101. As shown in FIG. 2A, reference symbol VG1 denotes a voltage of the control signal supplied, by the control circuit 106, to the gate of the ground-side transistor 102 via the signal line 109 and reference symbol VG2 denotes a voltage of the control signal supplied, by the control circuit 107, to the gate of the power-supply-side transistor 103. Reference symbol VS1 denotes a source voltage of the ground-side transistor 102 and reference symbol VS2 denotes a source voltage of the power-supplyside transistor 103. Reference symbol I denotes an electric current flowing through the heater 101.

In the following explanation, a ground voltage (0 V) is supplied to the conductive pad 104 and a power supply voltage (30 V) is supplied to the conductive pad 105. During the operation of the semiconductor device 100, the control circuit 106 maintains the voltage VG1 of the control signal to an ON voltage (2 V) of the ground-side transistor 102 regardless of whether discharge is performed. The control circuit 107 drives the heater 101 by switching the voltage VG2 of the control signal (pulse signal) between an ON voltage and an OFF voltage in accordance with a discharge control signal (for example, an image signal) supplied outside the semiconductor device 100. More specifically, the control circuit 107 changes the voltage VG2 of the control signal to an ON voltage (28 V) of the power-supply-side transistor 103 when the liquid is to be discharged by using the heater 101 and changes the voltage VG2 of the control signal to an OFF voltage (0 V) of the transistor 103 of the power supply side when no liquid is to be discharged. In this specification, the ON voltage of each transistor refers to a voltage supplied to the gate to turn on the transistor and the OFF voltage of each transistor refers to a voltage supplied to the gate to turn off the transistor.

Figure 3A:
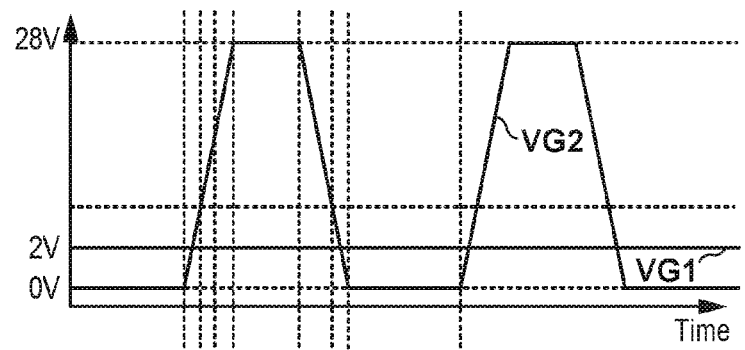
FIGS. 3A to 3D are timing charts for explaining the operation of the semiconductor device according to the embodiment of the present invention.
Figure 3B:
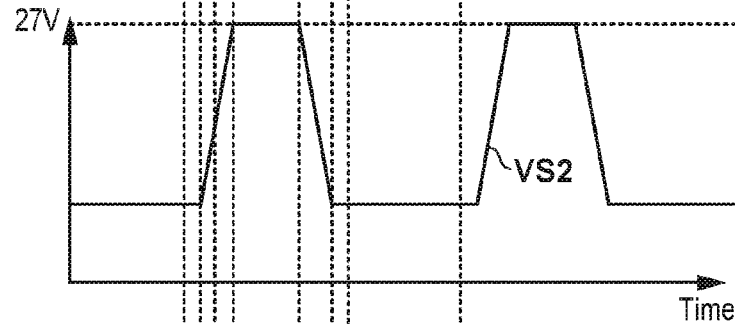
Figure 3C:
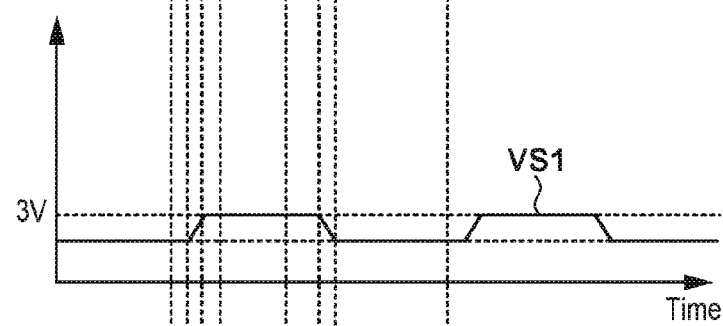
Figure 3D:
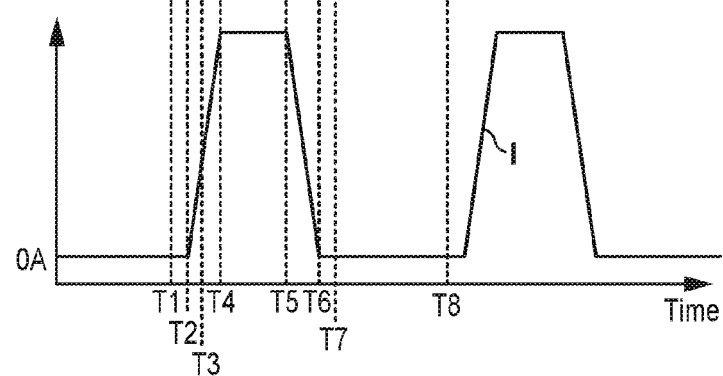
Figure 4A:
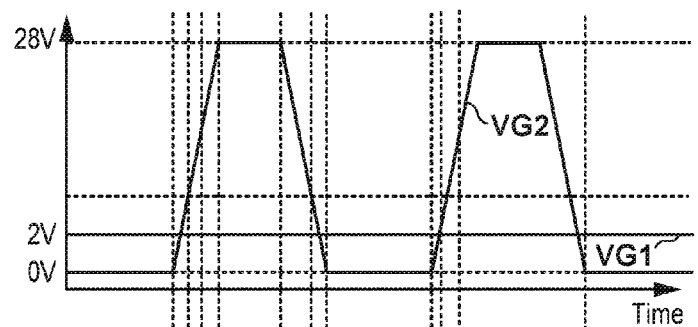
FIGS. 4A to 4D are timing charts for explaining the operation of the semiconductor device according to the embodiment of the present invention.
Figure 4B:
Figure 4C:
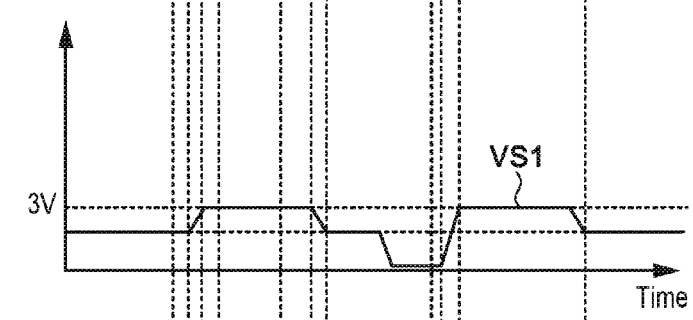
Figure 4D:
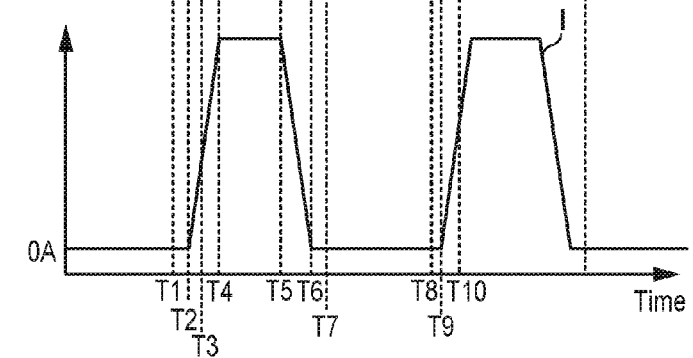

The abscissa of each timing chart in FIGS. 3A to 3D indicates a time. The ordinate of each timing chart in FIGS. 3A to 3C indicates a voltage value. The ordinate of the timing chart in FIG. 3D indicates an electric current value. FIG. 3A indicates the voltages VG1 and VG2. FIG. 3B indicates the voltage VS2. FIG. 3C indicates the voltage VS1. FIG. 3D indicates the electric current I.

Before time T1, the control circuit 107 maintains the voltage VG2 of the control signal supplied to the gate of the power-supply-side transistor 103 to the OFF voltage (0 V). In this case, the power-supply-side transistor 103 is turned off and the electric current I flowing through the heater 101 also changes to 0 A (that is, no electric current flows). The ground-side transistor 102 is also turned off because no electric current flows through the heater 101 while the ON voltage is supplied to the gate of the ground-side transistor 102. Therefore, two ends of the heater 101 are set in an electrically floating state, and both the voltages VS1 and VS2 become indefinite values. In this state, no electric current flows through the heater 101, and thus the voltage VS1 and the voltage VS2 become equal to each other in value.

When an instruction to discharge the liquid is given by the discharge control signal, the control circuit 107 changes the voltage VG2 of the control signal supplied to the gate of the power-supply-side transistor 103 from the OFF voltage (0 V) to the ON voltage (28 V) from the time T1 to time T4. If a gate voltage of the power-supply-side transistor 103 exceeds, at the time T2, a value obtained by adding a threshold voltage (1 V) of the power-supply-side transistor 103 to the source voltage VS2 (indefinite value) of the transistor on the power supply side, the power-supply-side transistor 103 is turned on. Accordingly, the power-supply-side transistor 103 operates as a source follower. As a result, the source voltage of the power-supply-side transistor 103 also rises as the gate voltage of the power-supply-side transistor 103 rises. When the power-supply-side transistor 103 is turned on, the electric current starts to flow from the drain to the source of the power-supply-side transistor 103, that electric current flows through the heater 101, and the source voltage VS1 of the ground-side transistor 102 also starts to rise.

At the time T3, if the source voltage VS1 of the ground-side transistor exceeds a value obtained by subtracting a threshold voltage (1 V) of the ground-side transistor 102 from a gate voltage of the ground-side transistor 102, the ground-side transistor 102 is turned on. Accordingly, the ground-side transistor 102 operates as a source follower. As a result, the source voltage VS1 of the ground-side transistor 102 is fixed (that is, held) to a value obtained by subtracting the threshold voltage (1 V) of the ground-side transistor 102 from the gate voltage (3 V) of the ground-side transistor 102. When the ground-side transistor 102 is turned on, the electric current starts to flow from the source to the drain of the ground-side transistor 102.

From the time T4 to time T5, the control circuit 107 maintains the voltage VG2 of the control signal supplied to the power-supply-side transistor 103 to the ON voltage (28 V). Consequently, the electric current continues to flow through the heater 101 and the liquid is discharged. Then, from the time T5 to time T7, the control circuit 107 changes the voltage VG2 of the control signal supplied to the power-supply-side transistor 103 from the ON voltage (28 V) to the OFF voltage (0 V). Following this change, the source voltage VS2 of the power-supply-side transistor 103 also drops.

The source voltage VS1 of the ground-side transistor 102 is fixed to 3 V. Therefore, at the time T6, the source voltage VS2 of the power-supply-side transistor 103 cannot follow a drop in the gate voltage of the power-supply-side transistor 103 and the power-supply-side transistor 103 is turned off. Consequently, the electric current I flowing through the heater 101 also stops and the ground-side transistor 102 is also turned off.

Then, liquid discharge is instructed again, the control circuit 107 starts, from time T8, the same operation as that from the time T1 to the time T4. In the example of FIGS. 3A to 3D, in two discharge operations, the source voltages VS1 of the ground-side transistor 102 at the times T1 and T8 at which the control signal from the control circuit 107 starts to rise are equal to each other. In this case, the electric current I starts to flow through the heater 101 after a lapse of a given time (T2−T1) from each of the times T1 and T8. While the voltage VG2 of the control signal from the control circuit 107 is the OFF voltage (0 V), however, the source of the ground-side transistor 102 is in the electrically floating state, and thus this source voltage VS1 has the indefinite value. Therefore, the source voltage VS1 of the ground-side transistor 102 may change by, for example, leakage currents of the ground-side transistor 102 and the power-supply-side transistor 103 or incidence of light outside the semiconductor device 100.

The operation of the semiconductor device 100 when the source voltage VS1 of the ground-side transistor 102 at the time T8 is lower than that at the time T1 will be explained with reference to FIGS. 4A to 4D. Each item of the timing charts in FIGS. 4A to 4D is the same as that in FIGS. 3A to 3D. In the following explanation, a discharge operation which starts from the time T1 will be called the first discharge operation and a discharge operation which starts from the time T8 will be called the second discharge operation.

As in the operation explained with reference to FIGS. 3A to 3D, the control circuit 107 also starts to raise, at the time T8, the voltage VG2 of the control signal from the OFF voltage (0 V) in FIGS. 4A to 4D. At time T9, if the gate voltage of the power-supply-side transistor 103 exceeds a value obtained by adding the threshold voltage (1 V) of the power-supply-side transistor 103 to the source voltage VS2

(indefinite value) of the transistor on the power supply side, the power-supply-side transistor 103 is turned on. The source voltage VS2 of the transistor on the power supply side at the time T9 is lower than that at the time T2. Therefore, a time (T9−T8) elapsed, in the second discharge operation, since the control circuit 107 starts to raise the voltage VG2 of the control signal till the electric current starts to flow through the heater 101 is shorter than the time (T2−T1) in the first discharge operation.

Then, at time T10, if the source voltage VS1 of the transistor on the power supply side exceeds a value obtained by subtracting the threshold voltage (1 V) of the ground-side transistor 102 from the gate voltage of the ground-side transistor 102, the ground-side transistor 102 is turned on. A time (T10−T9) elapsed, in the second discharge operation, since the power-supply-side transistor 103 is turned on till the ground-side transistor 102 is turned on is longer than the time (T3−T2) in the first discharge operation.

As oppose to an example of FIGS. 4A to 4D, a case will be explained in which the source voltage VS1 of the ground-side transistor 102 at the time T8 is higher than that at the time T1. In this case, a time elapsed since the second discharge operation starts till the electric current starts to flow through the heater 101 is longer than a time elapsed since the first discharge operation starts till the electric current starts to flow through the heater 101. Further, a time elapsed, in the second discharge operation, since the power-supply-side transistor 103 is turned on till the ground-side transistor 102 is turned on is shorter than the time in the first discharge operation.

As described above, the waveform of the electric current I flowing through the heater 101 may vary for each discharge operation owing to the fact that the source of the ground-side transistor 102 is in the electrically floating state. Consequently, image quality is decreased when, for example, the semiconductor device 100 is used to form an image. In this embodiment, such a variation in the waveform of the electric current I is reduced by including the stabilization circuits 111 in the semiconductor device 100.

The time elapsed since the power-supply-side transistor 103 is turned on till the ground-side transistor 102 is turned on depends on a time for charging or discharging a capacitance between the gate and the source of the ground-side transistor 102. When the semiconductor device does not include the stabilization circuit 111 as in the comparative example shown in FIG. 2B, charges needed for this discharge are supplied only from the control circuit 106.

On the other hand, in the semiconductor device 100 according to this embodiment, not only the control circuit 106 but also the stabilization circuits 111 are connected to the gates of the ground-side transistors 102. Therefore, the charges needed to charge or discharge the capacitance between the gate and the source of each ground-side transistor 102 are supplied not only from the control circuit 106 but also from the corresponding capacitive element 112 of the stabilization circuit 111. That is, each stabilization circuit 111 has a function of suppressing a variation in a gate voltage caused by charging or discharge of the capacitance between the gate and the source of the corresponding ground-side transistor 102. In this specification, such suppression of the variation in the voltage is referred to as stabilization of the voltage. As compared with the semiconductor device in the comparative example, the semiconductor device 100 according to this embodiment can shorten a time required for charging or discharging the capacitance between the gate and the source of each ground-side transistor 102 by stabilizing the gate voltage of each ground-side transistor 102. Accordingly, the variation in the waveform of the electric current I flowing through the heaters 101 is reduced.

An influence by the parasitic resistance and the capacitance of a wiring is reduced as the length of the wiring between each stabilization circuit 111 and the gate of the corresponding ground-side transistor 102 is shorter. This improves the effect of stabilizing the gate voltage by the stabilization circuit 111. Therefore, the stabilization circuit 111 may be arranged near the corresponding ground-side transistor 102. For example, the wiring length between each stabilization circuit 111 and the gate of the corresponding ground-side transistor 102 may be shorter than the wiring length between the control circuit 106 and the gate of the ground-side transistor 102. Further, the wiring length between each stabilization circuit 111 and the corresponding ground-side transistor 102 may be shorter than the wiring length between another arbitrary circuit element and the ground-side transistor 102. Alternatively, when one stabilization circuit 111 is arranged for one ground-side transistor 102, the wiring length between this stabilization circuit 111 and the ground-side transistor 102 may be shorter than the wiring length between this stabilization circuit 111 and another ground-side transistor 102.

As shown in FIG. 1, when one control circuit 106 is connected to the plurality of ground-side transistors 102 in common via the signal line 109, a large amount of electric currents may flow through the signal line 109 as a result of driving the plurality of heaters 101 at the same time. In the semiconductor device 100 of this embodiment, the gate voltage of each ground-side transistor 102 is stabilized by the corresponding stabilization circuit 111. Therefore, a large change in the gate voltage is suppressed even in such a case.

The capacitive element 112 of each stabilization circuit 111 may have the same arrangement as the gate capacitance of each ground-side transistor 102. For example, each ground-side transistor 102 is a MOS transistor which includes a part of an oxide film as a gate oxide film and each capacitive element 112 may be a MOS capacitor which includes another part of the oxide film. Further, a capacitance value of the gate capacitance of each ground-side transistor 102 and the capacitance value of each capacitive element 112 may be equal to each other.

In the above-described examples, the control circuit 106 maintains the voltage VG1 of the control signal to the ON voltage (2 V) of each ground-side transistor 102, and each control circuit 107 switches the voltage VG2 of the control signal between the ON voltage (28 V) and the OFF voltage (0 V) of each power-supply-side transistor 103. Instead of this, each control circuit 107 may maintain the voltage VG2 of the control signal to the ON voltage (28 V) of each power-supply-side transistor 103, and the control circuit 106 may switch the voltage VG1 of the control signal between the ON voltage (2 V) and the OFF voltage (0 V) of each ground-side transistor 102. In this case, each stabilization circuit 111 is connected to the gates of the power-supply-side transistors 103.

Furthermore, in the above-described examples, the control circuit 106 maintains the voltage VG1 of the control signal to the ON voltage (2 V) of each ground-side transistor 102 even while the voltage VG2 of the control signal supplied by each control circuit 107 is the OFF voltage (0 V) of each power-supply-side transistor 103. Instead of this, the control circuit 106 may switch the voltage VG1 of the control signal to the OFF voltage (0 V) of each ground-side transistor 102 in at least a part of a period during which the voltage VG2 of the control signal supplied by each control circuit 107 is the OFF voltage (0 V) of the corresponding power-supply-side transistor 103.

Figure 5A:
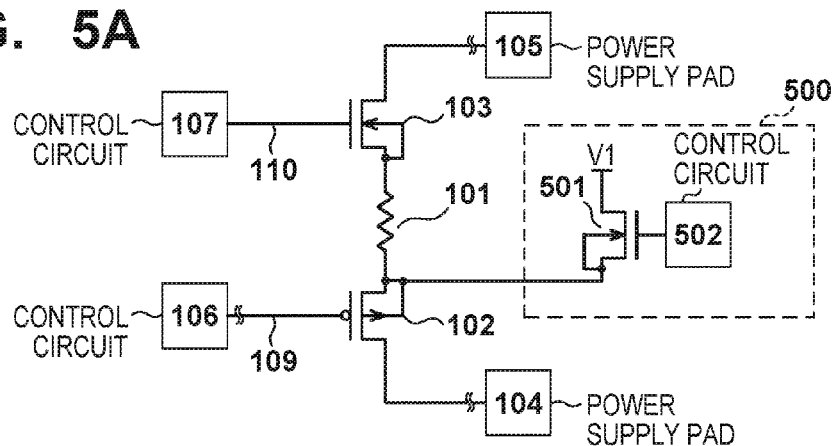
FIGS. 5A to 5C are circuit diagrams for explaining modifications of the semiconductor device according to the embodiment of the present invention.

Modifications of the semiconductor device 100 will now be explained with reference to FIGS. 5A to 5C. The semiconductor device 100 in the modification shown in FIG. 5A may be the same as the semiconductor device 100 shown in FIG. 1 except that the semiconductor device 100 includes a stabilization circuit 500 instead of the stabilization circuit 111. The stabilization circuit 500 has a function of stabilizing the source voltage VS1 of the ground-side transistor 102. More specifically, the stabilization circuit 500 has a function of raising the source voltage of the ground-side transistor 102 when the source voltage falls below a predetermined lower limit value. A practical arrangement example of the stabilization circuit 500 having such a function will be explained below.

The stabilization circuit 500 is connected to the source of the ground-side transistor 102. The stabilization circuit 500 includes a clip transistor 501 and a control circuit 502. The clip transistor 501 is, for example, an NMOS transistor. The source of the clip transistor 501 is connected to the source of the ground-side transistor 102. The drain of the clip transistor 501 is connected to a power supply voltage source V1. The gate of the clip transistor 501 is connected to the control circuit 502. The back gate of the clip transistor 501 is connected to the source of the clip transistor 501. As described above, the clip transistor 501 is arranged between the power supply voltage source V1 and the source of the ground-side transistors 102. The control circuits 502 supply control signals to the gates of the clip transistors 501 connected to the control circuits 502 individually. The wiring length between the stabilization circuit 500 and the ground-side transistor 102, the relationship between the stabilization circuit 500 and the block BLK, and the like are the same as in the stabilization circuit 111. Therefore, a repetitive explanation will be omitted.

In the following explanation, during the operation of the semiconductor device 100, the power supply voltage source V1 supplies a 5-V voltage and a control circuit 512 supplies a 2.5-V control signal. A threshold voltage of the clip transistor 501 is 1 V. As described above, when the source of the ground-side transistor 102 is in the electrically floating state, the source voltage of the ground-side transistor 102 is indefinite. If this source voltage falls below 1.5 V, a value obtained by subtracting the source voltage from the gate voltage of the clip transistor 501 exceeds the threshold voltage of the clip transistor 501. As a result, the clip transistor 501 is turned on, the electric current flows from the power supply voltage source V1 to the source of the ground-side transistor 102, and the source voltage of the ground-side transistor 102 rises. As described above, the stabilization circuit 500 clips the source voltage of the ground-side transistor 102 such that the source voltage falls within a range equal to or larger than the predetermined lower limit value. More specifically, when the source voltage of the ground-side transistor 102 falls within the range equal to or larger than the predetermined lower limit value, the clip transistor 501 is turned off, and the non-conductive state is set between the power supply voltage source V1 and the source of the ground-side transistor 102. On the other hand, when the source voltage of the ground-side transistor 102 falls outside the range equal to or larger than the predetermined lower limit value, the clip transistor 501 is turned on, and the conductive state is set between the power supply voltage source V1 and the source of the ground-side transistor 102. The predetermined lower limit value can be set based on the voltage supplied to the gate of the clip transistor 501. In other words, the stabilization circuit 500 clips the source voltage of the ground-side transistor 102 based on the voltage supplied to the gate of the clip transistor 501. A variation in the source voltage of the ground-side transistor 102 in the electrically floating state can be suppressed by including the stabilization circuit 500 in the semiconductor device 100. Therefore, the variation in the waveform of the electric current I flowing through the heater 101 during driving is reduced.

Figure 5B:
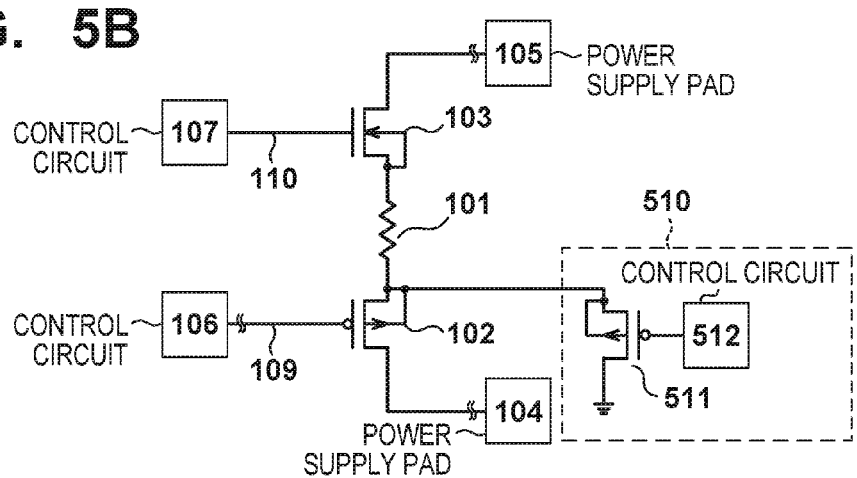

The semiconductor device 100 in the modification shown in FIG. 5B may be the same as the semiconductor device 100 shown in FIG. 1 except that the semiconductor device 100 includes a stabilization circuit 510 instead of the stabilization circuit 111. The stabilization circuit 510 has a function of stabilizing the source voltage VS1 of the ground-side transistor 102. More specifically, the stabilization circuit 510 has a function of lowering the source voltage of the ground-side transistor 102 when the source voltage exceeds a predetermined upper limit value. A practical arrangement example of the stabilization circuit 510 having such a function will be explained below.

The stabilization circuit 510 is connected to the source of the ground-side transistor 102. The stabilization circuit 510 includes a clip transistor 511 and a control circuit 512. The clip transistor 511 is, for example, a PMOS transistor. The source of the clip transistor 511 is connected to the source of the ground-side transistor 102. The drain of the clip transistor 511 is grounded. The gate of the clip transistor 511 is connected to the control circuit 512. The back gate of the clip transistor 511 is connected to the source of the clip transistor 511. As described above, the clip transistor 511 is arranged between a voltage source which supplies the ground voltage and the source of the ground-side transistors 102. The control circuits 512 supply control signals to the gates of the clip transistors 511 connected to the control circuits 512 individually. The wiring length between the stabilization circuit 510 and the ground-side transistor 102, the relationship between the stabilization circuit 510 and the block BLK, and the like are the same as in the stabilization circuit 111. Therefore, a repetitive explanation will be omitted.

In the following explanation, during the operation of the semiconductor device 100, the control circuit 512 supplies a 3.5-V control signal. A threshold voltage of the clip transistor 511 is 1 V. As described above, when the source of the ground-side transistor 102 is in the electrically floating state, the source voltage of the ground-side transistor 102 is indefinite. If this source voltage exceeds 4.5 V, a value obtained by subtracting the gate voltage from the source voltage of the clip transistor 511 exceeds the threshold voltage of the clip transistor 511. As a result, the clip transistor 511 is turned on, the electric current flows from the source of the ground-side transistor 102 to ground, and the source voltage of the ground-side transistor 102 drops. As described above, the stabilization circuit 510 clips the source voltage of the ground-side transistor 102 such that the source voltage falls within a range equal to or smaller than the predetermined upper limit value. More specifically, when the source voltage of the ground-side transistor 102 falls within the range equal to or smaller than the predetermined upper limit value, the clip transistor 511 is turned off, and the non-conductive state is set between ground and the source of the ground-side transistor 102. On the other hand, when the source voltage of the ground-side transistor 102 falls outside the range equal to or smaller than the predetermined upper limit value, the clip transistor 511 is turned on, and the conductive state is set between ground and the source of the ground-side transistor 102. The predetermined upper limit value can be set based on the voltage supplied to the gate of the clip transistor 511. In other words, the stabilization circuit 510 clips the source voltage of the ground-side transistor 102 based on the voltage supplied to the gate of the clip transistor 511. The variation in the source voltage of the ground-side transistor 102 in the electrically floating state can be suppressed by including the stabilization circuit 510 in the semiconductor device 100. Therefore, the variation in the waveform of the electric current I flowing through the heater 101 during driving is reduced.

Figure 5C:
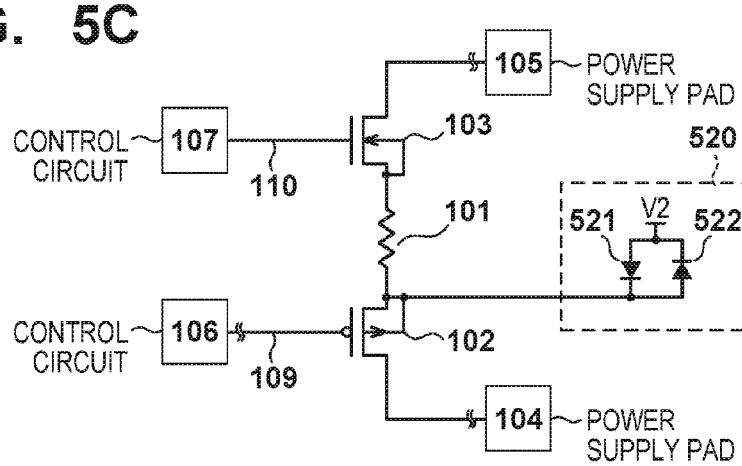

The semiconductor device 100 in the modification shown in FIG. 5C may be the same as the semiconductor device 100 shown in FIG. 1 except that the semiconductor device 100 includes a stabilization circuit 520 instead of the stabilization circuit 111. The stabilization circuit 520 has a function of stabilizing the source voltage VS1 of the ground-side transistor 102. More specifically, the stabilization circuit 520 has a function of raising the source voltage of the ground-side transistor 102 when the source voltage falls below the predetermined lower limit value and lowering the source voltage when the source voltage exceeds the predetermined upper limit value. A practical arrangement example of the stabilization circuit 520 having such a function will be explained below.

The stabilization circuit 520 is connected to the source of the ground-side transistor 102. The stabilization circuit 520 includes a clamp diode 521 and a clamp diode 522. The anode of the clamp diode 521 is connected to the source of the ground-side transistor 102. The cathode of the clamp diode 521 is connected to a power supply voltage source V2. The anode of the clamp diode 522 is connected to the power supply voltage source V2. The cathode of the clamp diode 522 is connected to the source of the ground-side transistor 102. That is, these clamp diodes 521 and 522 are connected between the power supply voltage source V2 and the source of the ground-side transistor 102. The wiring length between the stabilization circuit 520 and the ground-side transistor 102, the relationship between the stabilization circuit 520 and the block BLK, and the like are the same as in the stabilization circuit 111. Therefore, a repetitive explanation will be omitted.

In the following explanation, during the operation of the semiconductor device 100, the power supply voltage source V2 supplies a 3-V voltage. A forward voltage of the clamp diodes 521 and 522 is 1 V. As described above, when the source of the ground-side transistor 102 is in the electrically floating state, the source voltage of the ground-side transistor 102 is indefinite. If this source voltage exceeds 4.0 V, the electric current flows from the source of the ground-side transistor 102 to the power supply voltage source V2 via the clamp diode 522 and the source voltage of the ground-side transistor 102 drops. If this source voltage falls below 2.0 V, the electric current flows from the power supply voltage source V2 to the source of the ground-side transistor 102 via the clamp diode 521 and the source voltage of the ground-side transistor 102 rises. As described above, the stabilization circuit 520 clamps the source voltage of the ground-side transistor 102 such that the source voltage falls within the range equal to or larger than the predetermined lower limit value and equal to or smaller than the predetermined upper limit value. More specifically, both of the clamp diodes 521 and 522 are set in the non-conductive state, setting the non-conductive state between the power supply voltage source V2 and the source of the ground-side transistor 102 when the source voltage of the ground-side transistor 102 falls within the range equal to or larger than the predetermined lower limit value and equal to or smaller than the predetermined upper limit value. On the other hand, one of the clamp diodes 521 and 522 is set in the conductive state, setting the conductive state between the power supply voltage source V2 and the source of the ground-side transistor 102 when the source voltage of the ground-side transistor 102 falls outside the range equal to or larger than the predetermined lower limit value and equal to or smaller than the predetermined upper limit value. The variation in the source voltage of the ground-side transistor 102 in the electrically floating state can be suppressed by including the stabilization circuit 520 in the semiconductor device 100. Therefore, the variation in the waveform of the electric current I flowing through the heater 101 during driving is reduced. The stabilization circuit 520 may include only one of the clamp diodes 521 and 522, and may clamp the source voltage of the ground-side transistor 102 in a range defined only by the predetermined upper limit value or lower limit value. The stabilization circuit 520 may include the plurality of clamp diodes 521 connected in series or may include the plurality of clamp diodes 522 connected in series.

Figure 6A:
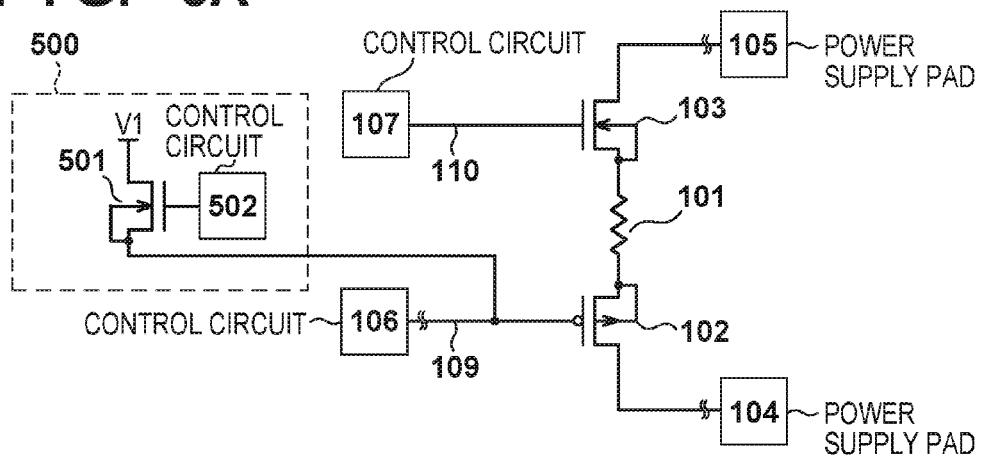
FIGS. 6A to 6C are circuit diagrams for explaining modifications of the semiconductor device according to the embodiment of the present invention.

Other modifications of the semiconductor device 100 will now be explained with reference to FIGS. 6A to 6C. The semiconductor device 100 in the modification shown in FIG. 6A may be the same as the semiconductor device 100 shown in FIG. 5A except that the stabilization circuit 500 is connected to the gate of the ground-side transistor 102. The wiring length between the stabilization circuit 500 and the ground-side transistor 102, the relationship between the stabilization circuit 500 and the block BLK, and the like are the same as in the stabilization circuit 111. Therefore, a repetitive explanation will be omitted. As described above, the gate voltage VS1 of the ground-side transistor 102 may not be stabilized only by connecting the control circuit 106 to the gate of the ground-side transistor 102. In the example of FIG. 6A, the stabilization circuit 500 has a function of stabilizing the gate voltage VS1 of the ground-side transistor 102.

Figure 6B:
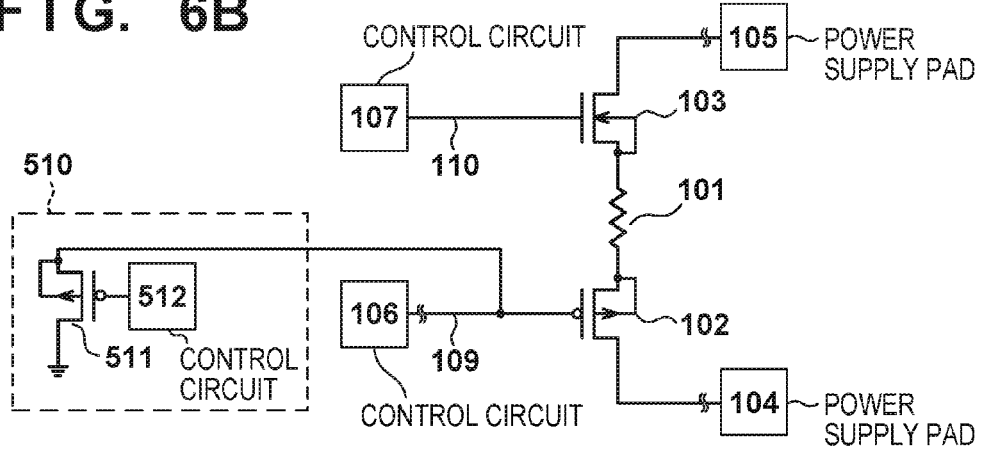
Figure 6C:
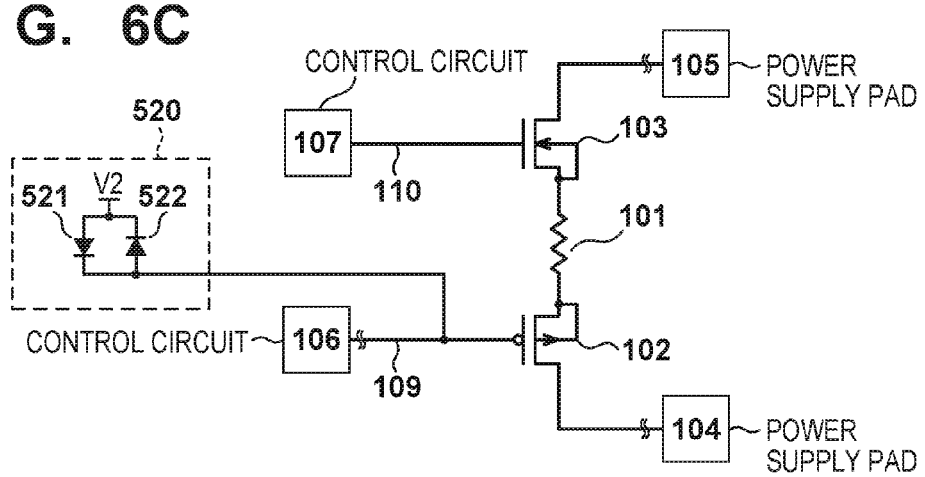

The semiconductor device 100 in the modification shown in FIG. 6B may be the same as the semiconductor device 100 shown in FIG. 5B except that the stabilization circuit 510 is connected to the gate of the ground-side transistor 102. The semiconductor device 100 in the modification shown in FIG. 6C may be the same as the semiconductor device 100 shown in FIG. 5C except that the stabilization circuit 520 is connected to the gate of the ground-side transistor 102. In the modifications shown in FIGS. 6B and 6C, each of the stabilization circuits 510 and 520 has a function of stabilizing the gate voltage VS1 of the ground-side transistor 102.

Figure 7A:
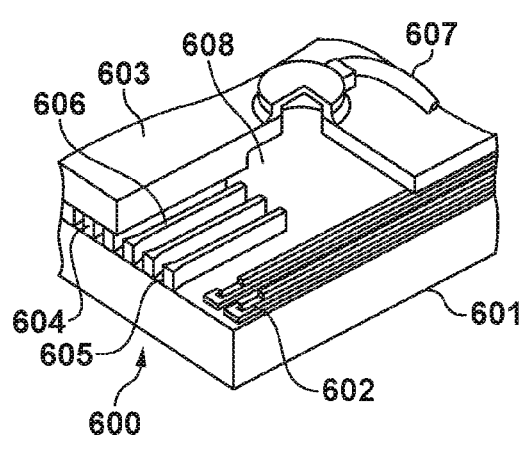
FIGS. 7A to 7D are views for explaining an application of a semiconductor device according to an embodiment of the present invention.

Next, a liquid discharge head, a liquid discharge cartridge, and a liquid discharge apparatus using the semiconductor device 100 explained in the above-mentioned embodiment will be explained below with reference to FIGS. 7A to 7D. As an example of the liquid discharge head, FIG. 7A shows the main components of a printhead 600 including the semiconductor device 100 explained in any of the above embodiments as a substrate 601. FIG. 7A depicts each heater 101 of the above-described embodiment as a heating unit 602. Also, a top plate 603 is partially cut away for the sake of explanation. As shown in FIG. 7A, the printhead 600 can be obtained by combining channel wall members 606 for forming channels 605 communicating with a plurality of orifices 604 and the top plate 603 having an ink supply port 607 to the substrate 601. In this structure, ink injected from the ink supply port 607 is stored in an internal common liquid chamber 608 and supplied to each channel 605, and the substrate 601 is driven in this state. Consequently, the ink is discharged from the orifices 604. The stabilization circuits 111 in the embodiment of FIG. 1, the stabilization circuits 500, 510, and 520 in the modifications of FIGS. 5A to 5C, and the stabilization circuits 500, 510, and 520 in the modifications of FIGS. 6A to 6C may be combined as needed to be mounted on one semiconductor device 100.

Figure 7B:
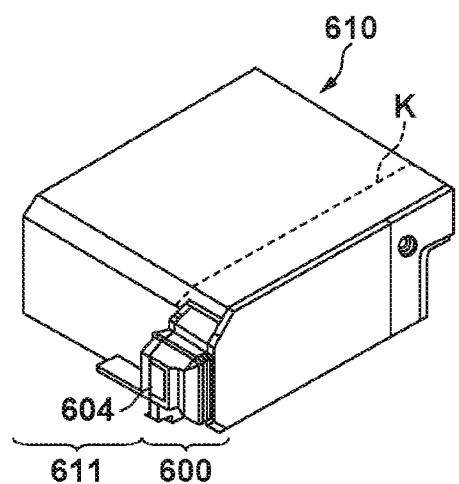

FIG. 7B is a view for explaining the overall configuration of an inkjet cartridge 610 as an example of the liquid discharge cartridge. The cartridge 610 includes the printhead 600 having the plurality of orifices 604 described above, and an ink container 611 containing ink to be supplied to the printhead 600. The ink container 611 as a liquid container is detachable from the printhead 600 from a boundary line K. The cartridge 610 has an electrical contact (not shown) for receiving a driving signal from the carriage side when incorporated into a printing apparatus shown in FIG. 7C, and the heating unit 602 is driven by this driving signal. A fibrous or porous ink absorber for holding ink is formed inside the ink container 611, and holds ink.

Figure 7C:
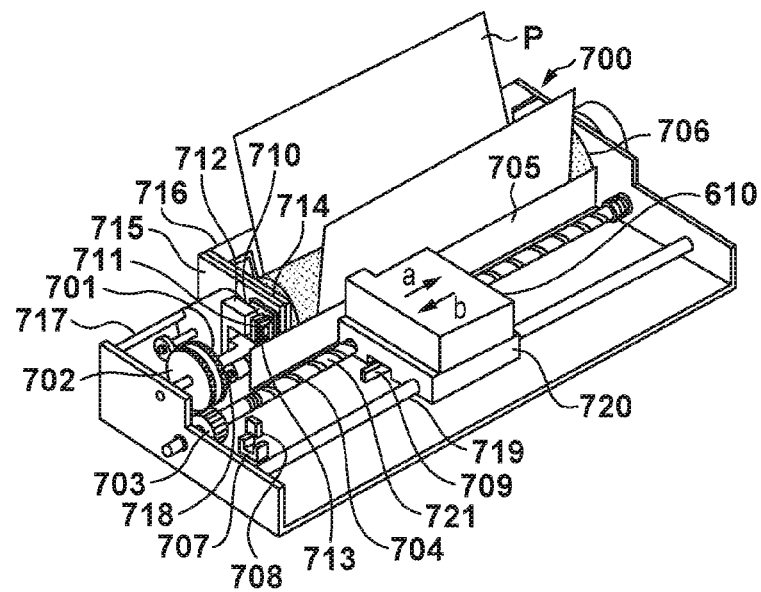

FIG. 7C is an external perspective view of an inkjet printing apparatus 700 as an example of the liquid discharge apparatus. An inkjet printing apparatus 700 incorporates a cartridge 610, and can implement high-speed printing and high-image-quality printing by controlling signals to be supplied to the cartridge 610. In the inkjet printing apparatus 700, the cartridge 610 is mounted on a carriage 720 which engages with a spiral groove 721 of a lead screw 704 which rotates via driving force transmission gears 702 and 703 in synchronism with the forward/reverse rotation of a driving motor 701. The cartridge 610 can move together with the carriage 720 forward and backward in the direction of an arrow a or b along a guide 719 by the driving force of the driving motor 701. A paper pressing plate 705 for printing paper P conveyed onto a platen 706 by a printing medium feeding device (not shown) presses the printing paper P against the platen 706 along the carriage moving direction. Photocouplers 707 and 708 check the existence of a lever 709 of the carriage 720 in a region where the photocouplers 707 and 708 are arranged, and detect a home position in order to, for example, switch the rotating directions of the driving motor 701. A support member 710 supports a cap member 711 which caps the entire surface of the cartridge 610. A suction unit 712 performs suction in the cap member 711, thereby performing suction recovery of the cartridge 610 through a cap opening. A moving member 715 makes a cleaning blade 714 movable back and forth, and the cleaning blade 714 and moving member 715 are supported by a body support plate 716. The cleaning blade 714 is not limited to the form shown in FIG. 7C, and a well-known cleaning blade is also applicable to this embodiment. In addition, a lever 717 is formed to start suction of the suction recovery. The lever 717 moves along with the movement of a cam 718 which engages with the carriage 720, and the movement is controlled by a well-known transmission method such as clutch switching of the driving force from the driving motor 701. A printing control unit (not shown) which supplies signals to the heating unit 602 formed in the cartridge 610 and controls the driving of each mechanism such as the driving motor 701 is formed in the apparatus main body.

Figure 7D:
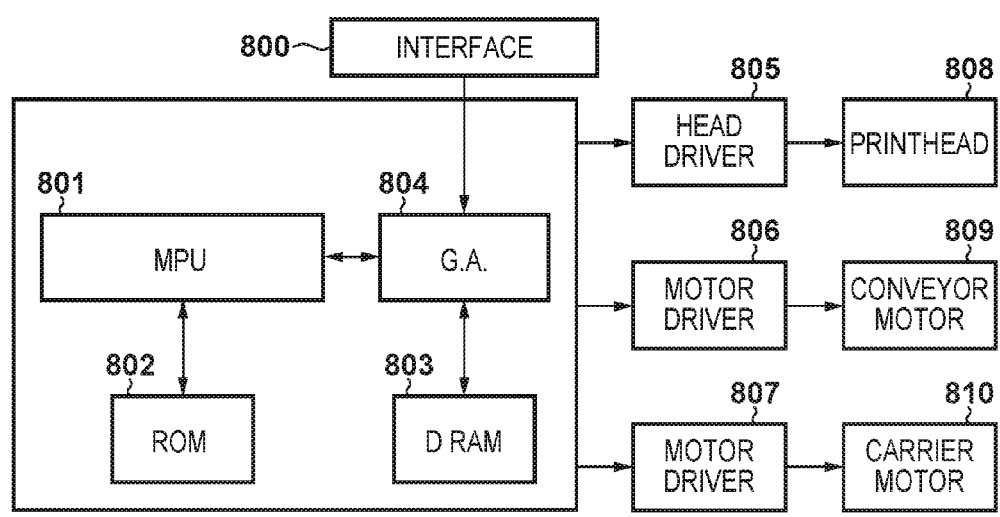

The configuration of a control circuit for executing printing control of the inkjet printing apparatus 700 will now be explained with reference to a block diagram shown in FIG. 7D. This control circuit includes an interface 800 which receives a printing signal, an MPU (Micro Processor) 801, and a program ROM 802 storing a control program to be executed by the MPU 801. The control circuit further includes a dynamic RAM (Random Access Memory) 803 for saving various kinds of data (for example, the above-mentioned printing signal and printing data to be supplied to a head), and a gate array 804 for controlling supply of printing data to a printhead 808. The gate array 804 also controls data transfer between the interface 800, the MPU 801, and the RAM 803. In addition, this control circuit includes a carrier motor 810 for conveying the printhead 808, and a conveyor motor 809 for conveying printing paper. Furthermore, this control circuit includes a head driver 805 for driving the printhead 808, and motor drivers 806 and 807 for respectively driving the conveyor motor 809 and the carrier motor 810. The operation of the above-mentioned control configuration will be explained below. When a printing signal is input to the interface 800, this printing signal is converted into a printing data for printing between the gate array 804 and the MPU 801. Then, the motor drivers 806 and 807 are driven, and the printhead is driven in accordance with the printing data supplied to the head driver 805, thereby performing printing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-112404, filed Jun. 2, 2015, which is hereby incorporated by reference herein in its entirety.

What is claimed is:

1. A semiconductor device for a liquid discharge head, the device comprising:
   a plurality of first transistors each including a first terminal, a second terminal, and a control terminal, and configured to receive a first voltage at the first terminal;
   a plurality of second transistors each including a first terminal, a second terminal, and a control terminal, and configured to receive a second voltage at the first terminal;
   a plurality of discharge elements configured to discharge a liquid, each discharge element being connected between the second terminal of one of the plurality of first transistors and the second terminal of one of the plurality of second transistors;
   a first control circuit configured to supply a first control signal for controlling a conductive state of the plurality of first transistors to the control terminals of the plurality of first transistors via a common signal line connected to the plurality of first transistors; and
   a stabilization circuit configured to stabilize a voltage of at least one of the second terminal of the first transistor or the control terminal of the first transistor.

2. The device according to claim 1, wherein if the second transistors are OFF, the second terminals of the first transistors are in an electrically floating state.

3. The device according to claim 1, wherein the stabilization circuit includes a capacitive element having a first electrode and a second electrode, and
   the first electrode of the capacitive element is connected to the common signal line.

4. The device according to claim 3, wherein the first transistors comprise MOS transistors, and
   the capacitive element comprises a MOS capacitor.

5. The device according to claim 1, wherein the stabilization circuit is connected between a voltage source, and one of the second terminal and the control terminal of the first transistors, sets a non-conductive state between the one terminal and the voltage source when a voltage of the one terminal falls within a predetermined range, and sets the conductive state between the one terminal and the voltage source when the voltage of the one terminal falls outside the predetermined range.

6. The device according to claim 5, wherein the one terminal is the second terminal.

7. The device according to claim 5, wherein the one terminal is the control terminal.

8. The device according to claim 1, wherein the stabilization circuit includes a third transistor connected between a voltage source, and one of the second terminal and the control terminal of the first transistor, and the stabilization circuit clips a voltage of the one terminal based on a voltage supplied to a control terminal of the third transistor.

9. The device according to claim 1, wherein a wiring length between the stabilization circuit and the first transistor is shorter than a wiring length between the first control circuit and the first transistor.

10. The device according to claim 1, wherein the semiconductor device includes a plurality of stabilization circuits, the plurality of first transistors, the plurality of second transistors, and the plurality of discharge elements are divided into a plurality of blocks, one of the plurality of blocks includes one or more discharge elements, and one or more first transistors and one or more second transistors connected to the discharge elements, and each of the plurality of stabilization circuits is arranged for one of the plurality of blocks.

11. The device according to claim 1, further comprising a second control circuit configured to supply second control signals for controlling the conductive states of the plurality of second transistors individually to the control terminals of the second transistors.

12. The device according to claim 1, wherein the second voltage is higher than the first voltage.

13. The device according to claim 1, wherein the control terminal is a gate, the first terminal is a drain, and the second terminal is a source.

14. A liquid discharge head comprising,
a semiconductor device according to claim 1, and
an orifice configured to discharge a liquid under control of the semiconductor device.

15. A liquid discharge apparatus comprising;
the liquid discharge head according to claim 14; and
a supply unit configured to supply a driving signal for causing the semiconductor device to discharge a liquid.

16. A liquid discharge cartridge comprising:
a semiconductor device according to claim 1;
an orifice configured to discharge a liquid under control of the semiconductor device; and
a liquid container configured to contain ink.

17. A semiconductor device for a liquid discharge head, the device comprising:
a plurality of first transistors each including a first terminal, a second terminal, and a control terminal, and configured to receive a first voltage at the first terminal;
a plurality of second transistors each including a first terminal, a second terminal, and a control terminal, and configured to receive a second voltage at the first terminal;
a plurality of discharge elements configured to discharge a liquid, each discharge element being connected between the second terminal of one of the plurality of first transistors and the second terminal of one of the plurality of second transistors;
a first control circuit configured to supply a first control signal for controlling a conductive state of the plurality of first transistors to the control terminals of the plurality of first transistors via a common signal line connected to the plurality of first transistors; and
a capacitor including an electrode connected to the control terminal of the first transistor.

18. The device according to claim 17, further comprising a second control circuit configured to supply second control signals for controlling the conductive states of the plurality of second transistors individually to the control terminals of the second transistors.

* * * * *